(12) United States Patent
Nishio et al.

(10) Patent No.: US 8,679,957 B2
(45) Date of Patent: Mar. 25, 2014

(54) METHOD OF MANUFACTURING SEMICONDUCTOR DEVICE

(75) Inventors: Johji Nishio, Tokyo (JP); Chiharu Ota, Kanagawa (JP); Takashi Shinohe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/602,517

(22) Filed: Sep. 4, 2012

(65) Prior Publication Data

US 2013/0237042 A1   Sep. 12, 2013

(51) Int. Cl.
*H01L 21/20* (2006.01)

(52) U.S. Cl.
USPC ............... 438/508; 438/514; 257/E21.057

(58) Field of Classification Search
USPC ......... 438/170, 171, 189, 190, 341, 495, 499, 438/505, 506; 257/E21.041, E21.042, 257/E21.043, E21.045, E21.049, E21.056, 257/E21.057, E21.059
See application file for complete search history.

(56) References Cited

U.S. PATENT DOCUMENTS

| 7,018,554 | B2 | 3/2006 | Sumakeris |  |
|---|---|---|---|---|
| 2004/0149993 | A1* | 8/2004 | McClure et al. | 257/79 |
| 2010/0221917 | A1* | 9/2010 | Masuda | 438/692 |
| 2011/0193101 | A1* | 8/2011 | Yanase et al. | 257/77 |

FOREIGN PATENT DOCUMENTS

JP     2006-66722     3/2006

* cited by examiner

*Primary Examiner* — Cheung Lee
(74) *Attorney, Agent, or Firm* — Oblon, Spivak, McClelland, Maier & Neustadt, L.L.P.

(57) ABSTRACT

A method of manufacturing a semiconductor device of an embodiment includes: preparing a silicon carbide substrate of a hexagonal system; implanting ions into the silicon carbide substrate; forming, by epitaxial growth, a silicon carbide film on the silicon carbide substrate into which the ions have been implanted; and forming a pn junction region in the silicon carbide film.

8 Claims, 4 Drawing Sheets

STEP FLOW DIRECTION
(<21-30>DIRECTION)

METHOD OF MANUFACTURING SEMICONDUCTOR DEVICE

CROSS-REFERENCE TO RELATED APPLICATION

This application is based upon and claims the benefit of priority from Japanese Patent Application No. 2012-046503, filed on Mar. 2, 2012, the entire contents of which are incorporated herein by reference.

FIELD

Embodiments described herein relate generally to a method of manufacturing a semiconductor device.

BACKGROUND

Silicon carbide has been drawing attention as a suitable material of a semiconductor device for attaining a high breakdown voltage and a high current capacity. For example, when manufacturing a bipolar power device with a silicon carbide material, a silicon carbide film is formed on a bulk silicon carbide substrate of a hexagonal system by epitaxial growth, and a pn junction region is formed in the silicon carbide film.

There exists a dislocation referred to as a basal plane dislocation (BPD) in the silicon carbide substrate, and this BPD may be propagated or extended into the silicon carbide film formed by epitaxial growth. A device having the BPD therein is known to have an increased on-resistance when supplied with electricity. The mechanism is considered to: easily disintegrate the BPD into partial dislocations with supplied electricity; and form a high-resistance layer by a stacking fault on a plane between the disintegrated partial dislocations.

On the other hand, step-flow growth of the silicon carbide film is important in order to obtain a smooth surface on an epitaxially grown film. The silicon carbide substrate used for realizing satisfactory step-flow growth is usually off-cut by few degrees from a (0001) plane (a basal plane).

When the silicon carbide substrate with an off-cut angle of 4 degrees is used, the proportion of the BPD in the substrate directly propagated into the epitaxially grown film is considered to decrease remarkably compared with the case where the substrate with the off-cut angle of 8 degrees is used. There is also a reported case where only 3% of the BPD is propagated.

Even with this proportion, the surface of the epitaxial film would have the BPD density of 30 cm$^{-2}$ when the BPD density in the bulk silicon carbide substrate is approximately 1000 cm$^{-2}$. Thus, this would be a problem in terms of the manufacturing yield when a power device of a large area is to be formed for attaining high capacity.

DETAILED DESCRIPTION

A method of manufacturing a semiconductor device of an embodiment includes: preparing a silicon carbide substrate of a hexagonal system; implanting ions into the silicon carbide substrate; forming, by epitaxial growth, a silicon carbide film on the silicon carbide substrate into which the ions have been implanted; and forming a pn junction region in the silicon carbide film.

First Embodiment

A method of manufacturing a semiconductor device of the present embodiment includes: preparing a silicon carbide substrate of a hexagonal system; implanting ions into the silicon carbide substrate; forming, by epitaxial growth, a silicon carbide film on the silicon carbide substrate into which the ions have been implanted; and forming a pn junction region in the silicon carbide film.

By the above configuration, the method of manufacturing a semiconductor device of the present embodiment can suppress propagation or extension of a BPD within the silicon carbide substrate into the silicon carbide film that is an epitaxially grown film. Consequently, a semiconductor device can be manufactured in which performance deterioration caused by the BPD is prevented.

FIGS. 1 to 4 are process cross-sectional views illustrating the method of manufacturing a semiconductor device of the present embodiment. In the present embodiment, the semiconductor device will be described with an example of a mesa-type PiN diode with a high breakdown voltage that is one kind of a silicon carbide bipolar power device.

Figure 1:
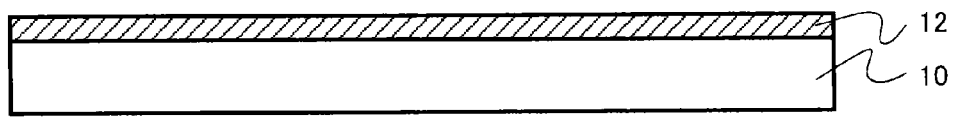
FIG. 1 is a process cross-sectional view illustrating a method of manufacturing a semiconductor device of a first embodiment.

First, a silicon carbide substrate 10 with an n$^+$-type (0001) plane of a 4H silicon carbide bulk single crystal of a hexagonal system is prepared as shown in FIG. 1. It is preferable that the silicon carbide substrate 10 be off-cut so that the surface thereof would have an off angle of 1 degree or greater and 8 degrees or less with respect to the (0001) plane, in terms of realizing satisfactory step-flow growth when performing epitaxial growth at a later stage.

Then, ions of an impurity are implanted throughout the silicon carbide substrate 10 to form an ion-implanted region 12. For example, phosphorus (P) that is an n-type impurity is implanted with a dose of $1\times10^{17}$ cm$^{-2}$ and an accelerating voltage of 380 keV. This ion-implanted region 12 can suppress the propagation of the BPD within the silicon carbide substrate 10 into the epitaxial film when performing epitaxial growth at a later stage.

Figure 2:
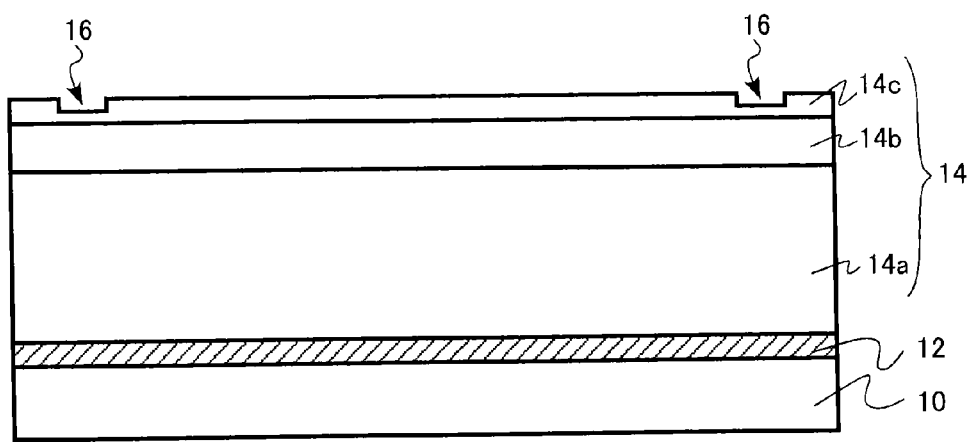
FIG. 2 is a process cross-sectional view illustrating the method of manufacturing a semiconductor device of the first embodiment.

Next, as shown in FIG. 2, a silicon carbide film 14 is formed, by epitaxial growth, on the silicon carbide substrate 10 into which the ions have been implanted. The silicon carbide film 14 includes: an n-type silicon carbide film 14a as a drift layer; a p-type silicon carbide film 14b as a p-type layer; and a p+-type silicon carbide film 14c as a p-type contact layer.

For example, the n-type silicon carbide film 14a is formed by epitaxial growth in a furnace for n-type growth such that the film would have a thickness of 26 μm and a carrier concentration of $4 \times 10^{15}$ cm$^{-3}$. Thereafter, the p-type silicon carbide film 14b and the p+-type silicon carbide film 14c are formed by epitaxial growth in a furnace for p-type growth.

An alignment mark 16 is then formed in the silicon carbide film 14 by dry etching.

Figure 3:
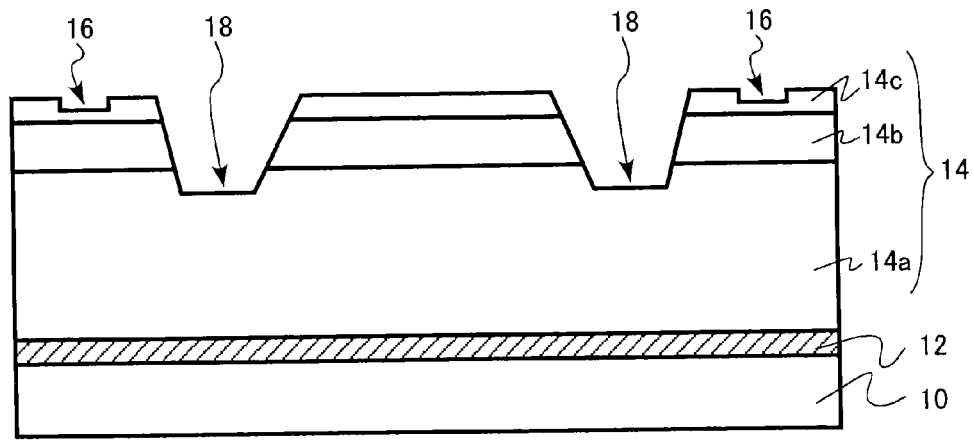
FIG. 3 is a process cross-sectional view illustrating the method of manufacturing a semiconductor device of the first embodiment.

Next, as shown in FIG. 3, a pattern is formed by a resist or the like with the alignment mark 16 as a fiducial mark, and a groove 18 is formed by dry etching, thereby forming a mesa-type electrode part surrounded by the groove 18. The width of the mesa-type electrode part is approximately 1 mm, for example.

At this time, the p-type silicon carbide film 14b is etched so that it is entirely removed in a depth direction. The depth of dry etching can be controlled by managing an etching time, for example.

Figure 4:
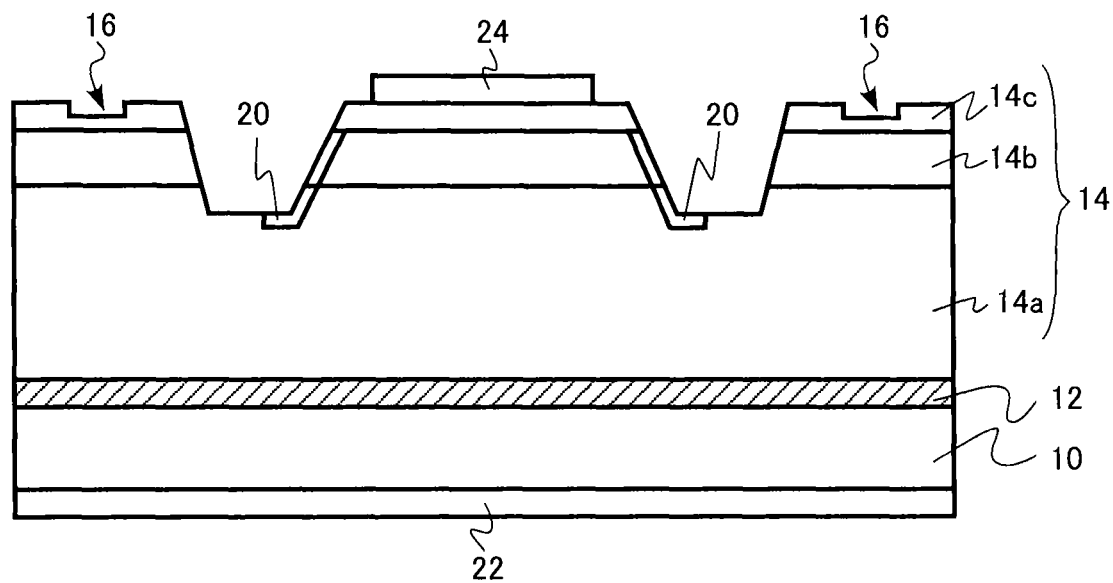
FIG. 4 is a process cross-sectional view illustrating the method of manufacturing a semiconductor device of the first embodiment.

Next, ions of aluminum (Al) that is a p-type impurity are selectively implanted, for example. By this ion implantation, a p-type layer 20 being a junction termination structure is formed as shown in FIG. 4.

After implanting the ions, the implanted ionic species (the impurity) is activated by high-temperature annealing. The high-temperature annealing is performed at a temperature of 1600° C. to 1900° C. under an inert gas atmosphere of argon (Ar) or the like, for example.

Then, a cathode electrode 22 is formed on the back surface of the silicon carbide substrate 10. The cathode electrode 22 is formed by vapor-depositing nickel (Ni) on the entire back surface of the silicon carbide substrate 10, sintering it, and sputtering titanium (Ti), nickel (Ni), and gold (Au) in this order, for example.

Then, an anode electrode 24 is formed on the p+-type silicon carbide film 14c serving as the p-type contact layer of the mesa-type electrode part. The anode electrode 24 is formed by sputtering aluminum (Al) on the p+-type silicon carbide film 14c and patterning thereafter, for example.

By the manufacturing method above, the mesa-type PiN diode with a high breakdown voltage of the present embodiment is formed.

According to the present embodiment, the ion-implanted region 12 is formed by implanting ions of the impurity into the silicon carbide substrate 10 before forming the silicon carbide film 14 on the silicon carbide substrate 10 by epitaxial growth. An area including a number of dislocations or sub-boundaries is formed in this ion-implanted region, where the crystalline structure of the silicon carbide is destroyed due to damage done by the ion implantation. This ion-implanted region serves as a dislocation-blocking layer for suppressing propagation of the BPD within the silicon carbide substrate 10 into the silicon carbide film 14.

According to microscopic observations by the inventor, the BPD is terminated by the interaction between the BPD and a dislocation having a Burgers vector directed oppositely from the BPD, or a dislocation loop is formed with the sub-boundaries being the surface thereof. It is confirmed that, as a result of the above, the BPD would not be propagated into the silicon carbide film 14 that is the epitaxial film.

Moreover, it is preferred that the surface of the ion-implanted region 12 be undamaged by the ion implantation as much as possible, in order to ensure epitaxial growth with superior crystallinity on the ion-implanted region 12. From this point of view, it is preferred to implant the ions under a condition that a projected range (Rp), at which the ion concentration would be the maximum, falls within the silicon carbide substrate 10.

Therefore, for example, it is preferred that the ions be directly implanted into the silicon carbide substrate 10 with the surface thereof exposed, without forming a film such as an insulating film, what is called a through film, on the silicon carbide substrate 10. Moreover, it is preferred that the ions be implanted under a condition that the impurity concentration on the surface of the silicon carbide substrate 10 right after the ion implantation would be lower by one order of magnitude or more than the maximum impurity concentration when the ion-implanted region is viewed in a depth direction.

Furthermore, it is preferred not to recover from the damage caused by the ion implantation as much as possible in view of suppressing the propagation of the BPD. Therefore, it is preferred that the ions be implanted with a temperature of the silicon carbide substrate 10 of 100° C. or less, at which little is recovered from the damage caused by the ion implantation. The ions are preferably implanted at room temperature. Here, the ion implantation at room temperature implies the ion implantation during which the silicon carbide substrate 10 is not heated.

The ionic species (impurity) being implanted is not particularly limited as long as it effectively causes damage to the silicon carbide substrate 10. For example, phosphorus (P), nitrogen (N), boron (B), and aluminum (Al) can be used.

In terms of increasing damage to the silicon carbide substrate 10, it is preferable to use the ionic species with a large ionic radius and large mass such as P (phosphorus).

In addition, in terms of inhibiting the ion-implanted region 12 as a high-resistance layer from obstructing the device operation, it is preferred that the ionic species of the conductivity type identical to that of the silicon carbide substrate 10 be implanted. As in the present embodiment, for example, it is preferred to implant ions of an n-type impurity such as phosphorus (P) and nitrogen (N) when the substrate is an n+-type semiconductor substrate.

Moreover, a dose of the ions implanted is preferably 1E15 cm$^{-2}$ or greater and 1E17 cm$^{-2}$ or less. If the dose falls below this range, the silicon carbide substrate 10 may not receive enough damage. If the dose exceeds this range, on the other hand, the ion-implanted region 12 may obstruct the device operation as the high-resistance layer, or excess damage done to the surface of the silicon carbide substrate 10 may obstruct epitaxial growth with superior crystallinity.

With regards to the silicon carbide substrate 10, an off direction, namely, a crystal orientation of the maximum angle of inclination of the silicon carbide substrate 10 with respect to the (0001) plane is preferably in a direction of <21-30>±5 degrees. This is to inhibit the stacking fault from being generated by the BPD propagated into the epitaxial film.

That is, by having the off direction in the <21-30> direction, a portion of the BPD that is within the silicon carbide substrate 10 and extending in the <21-30> direction would be propagated into the silicon carbide film 14. As a result, it would be unlikely for the BPD to be disintegrated into a Shockley partial dislocation which is parallel to a <11-20> or <10-10> direction bearing one side of the stacking fault. Therefore, the generation of the stacking fault caused by supplying electricity can likely be avoided even when the BPD within the silicon carbide substrate 10 is propagated as the BPD into the silicon carbide film 14.

As a result, by having the off direction in the direction of <21-30>±5 degrees, the deterioration in device characteristics due to the stacking fault generated from the BPD can be suppressed even if there exists the BPD, the propagation of which into the silicon carbide film 14 could not be obstructed by the ion-implanted region 12.

Second Embodiment

A second embodiment is similar to the first embodiment except that ions are selectively implanted into the silicon carbide substrate, and that a region formed by shifting the pn junction region used for device operation by d/tan α toward an upstream side in a step-flow direction of the silicon carbide film, which is grown by epitaxial growth, is included in an ion-implanted region, where d denotes the thickness of the silicon carbide film and a denotes an off angle of the silicon carbide substrate with respect to a (0001) plane. Thus, description of the contents overlapping the first embodiment will be partly omitted.

FIGS. 5 to 8B are process cross-sectional views illustrating a method of manufacturing a semiconductor device of the present embodiment.

Figure 5:
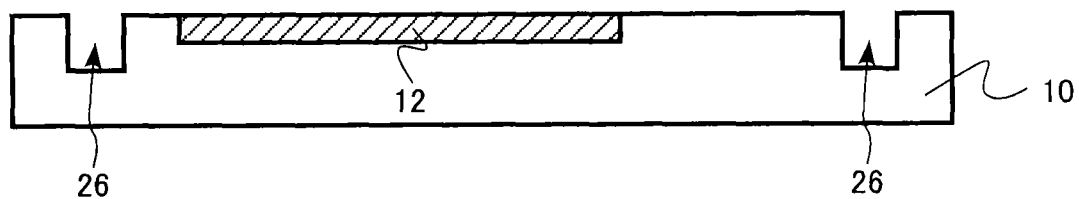
FIG. 5 is a process cross-sectional view illustrating a method of manufacturing a semiconductor device of a second embodiment.

First, a silicon carbide substrate 10 with an n⁺-type (0001) plane of a 4H silicon carbide bulk single crystal of a hexagonal system is prepared as shown in FIG. 5. The silicon carbide substrate 10 is off-cut so that the surface thereof would have an off angle of 1 degree or greater and 8 degrees or less with respect to the (0001) plane, for example.

Then, an alignment mark 26 is formed on the silicon carbide substrate 10 by dry etching. A pattern is then formed by a resistor the like with the alignment mark 26 as a fiducial mark, and ions are selectively implanted into a predetermined region of the silicon carbide substrate 10 to form an ion-implanted region 12.

Figure 6:
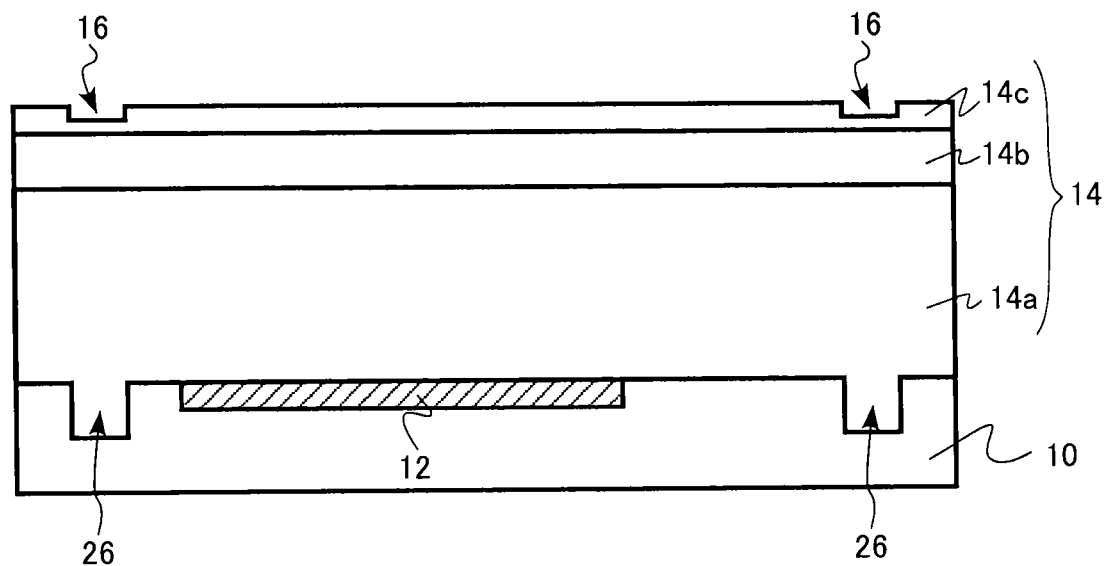
FIG. 6 is a process cross-sectional view illustrating the method of manufacturing a semiconductor device of the second embodiment.

Next, as shown in FIG. 6, a silicon carbide film 14 is formed, by epitaxial growth, on the silicon carbide substrate 10 into which the ions have been implanted. The silicon carbide film 14 includes: an n-type silicon carbide film 14a as a drift layer; a p-type silicon carbide film 14b as a p-type layer; and a p⁺-type silicon carbide film 14c as a p-type contact layer.

Thereafter, an alignment mark 16 is formed in the silicon carbide film 14 by dry etching. At this time, a pattern of the alignment mark 16 is formed with the alignment mark 26 as a fiducial mark. Here, the depth of the alignment mark 16 would not affect the reading and positioning even when the alignment mark 16 is formed shallower than the depth of the alignment mark 26.

Figure 7:
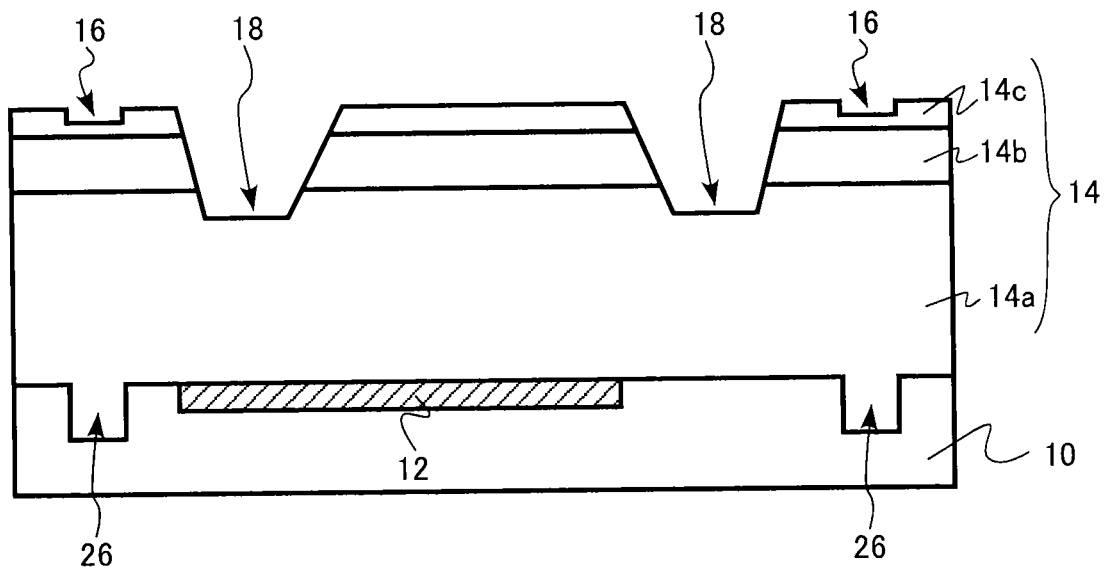
FIG. 7 is a process cross-sectional view illustrating the method of manufacturing a semiconductor device of the second embodiment.

Next, as shown in FIG. 7, a pattern is formed by a resist or the like with the alignment mark 16 as the fiducial mark, and a groove 18 is formed by dry etching, thereby forming a mesa-type electrode part surrounded by the groove 18.

Then, ions of aluminum (Al) that is a p-type impurity are selectively implanted, for example. By this ion implantation, the p⁻-type layer 20 being the junction termination structure is formed as shown in FIG. 8.

After implanting the ions, the implanted ionic species (the impurity) is activated by high-temperature annealing.

Then, the cathode electrode 22 is formed on the back surface of the silicon carbide substrate 10. Moreover, the anode electrode 24 is formed on the p⁺-type silicon carbide film 14c serving as the p-type contact layer of the mesa-type electrode part.

By the manufacturing method above, the mesa-type PiN diode with a high breakdown voltage of the present embodiment is formed.

There is a possibility that the ion-implanted region 12 would obstruct the device operation as a high-resistance layer. It is thus preferred not to form it as much as possible in a region where it is not necessary, considering the device characteristics.

The deliberation by the inventor has manifested that, even if the BPD is propagated into the silicon carbide film 14, the device characteristics would not be deteriorated as long as the BPD does not reach the pn junction region geometrically. Accordingly, in the present embodiment, the range of the ion-implanted region 12 is set so as to ensure, at a bare minimum, that the BPD would not geometrically reach the pn junction region even if it is propagated into the silicon carbide film 14.

Specifically, the ion-implanted region 12 is set to include the region formed by shifting the pn junction region used for device operation by d/tan α toward the upstream side in the step-flow direction of the silicon carbide film 14, which is grown by epitaxial growth, where d denotes the thickness of the silicon carbide film 14 and a denotes the off angle of the silicon carbide substrate 10 with respect to the (0001) plane.

Figure 8A:
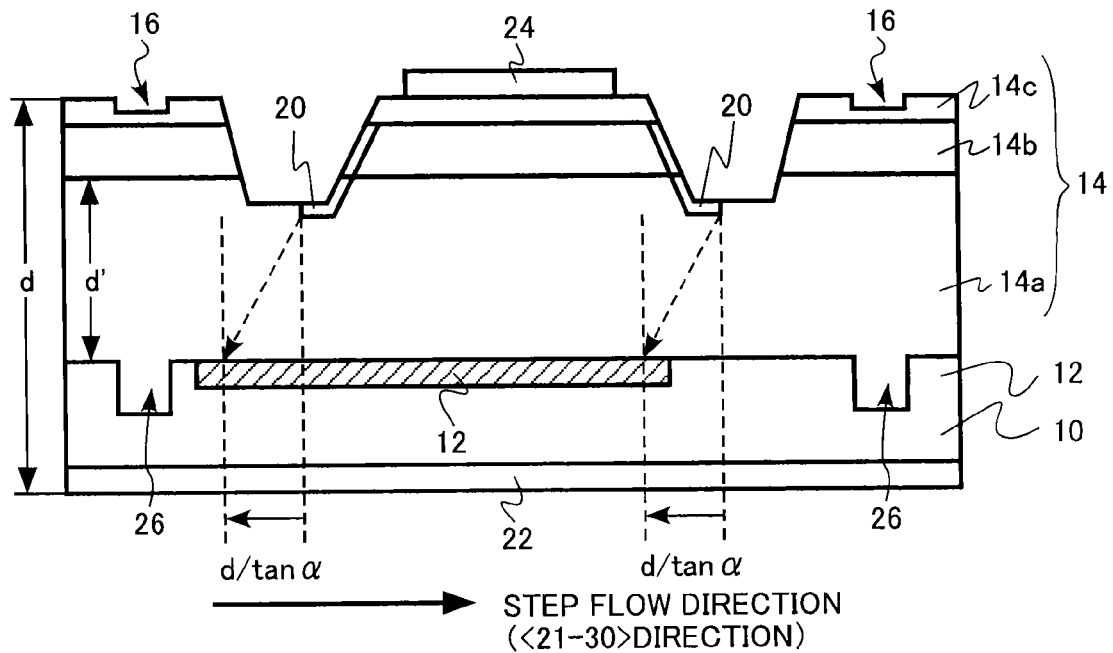
FIGS. 8A and 8B are process cross-sectional views illustrating the method of manufacturing a semiconductor device of the second embodiment.
Figure 8B:
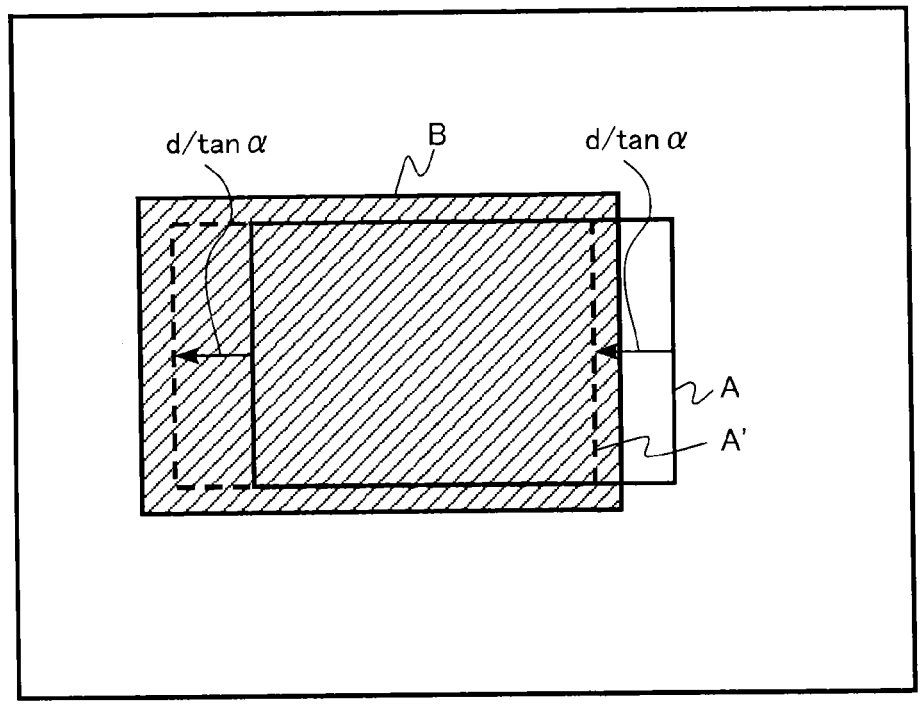

FIG. 8A is a cross-sectional view of the semiconductor device of the present embodiment, and FIG. 8B is a top view of the semiconductor device of the present embodiment. In FIG. 8B, A indicates the pn junction region, and A' indicates the region formed by shifting the pn junction region by d/tan α toward the upstream side in the step-flow direction of the silicon carbide film 14 that is grown by epitaxial growth. In addition, B indicates the ion-implanted region 12. In the present embodiment, the pn junction region is the region including: the pn junction between the p-type silicon carbide film 14b of the mesa-type electrode part and the n⁻-type silicon carbide film 14a; and the pn junction between the p⁻-type layer 20 and the n⁻-type silicon carbide film 14a.

When the BPD is propagated into the silicon carbide film 14, it is geometrically propagated in the step-flow direction or, for example, in the <21-30> direction on the (0001) plane, in the present embodiment. Therefore, by setting the ion-implanted region 12 as described in the present embodiment, it is ensured that the BPD propagated into the silicon carbide film 14 would not reach the pn junction region.

Thus, according to the present embodiment, the ion-implanted region 12 is formed to the minimum extent in the region considered not necessary in terms of device characteristics, in addition to the effects of the first embodiment. This can thereby prevent the ion-implanted region 12 being the high-resistance layer from possibly obstructing the device operation.

Here, the pn junction region used for the device operation is shifted by d/tan α toward the upstream side in the step-flow direction of the silicon carbide film 14 that is grown by epitaxial growth, where d denotes the thickness of the silicon carbide film 14 and a denotes the off angle of the silicon carbide substrate 10 with respect to the (0001) plane. In the present embodiment, the pn junction surface is provided closer to the n⁻-type silicon carbide film 14a than to the boundary surface between the p-type silicon carbide film 14b and the n⁻-type silicon carbide film 14a. Therefore, the BPD would not reach the pn junction region if the pn junction region used for the device operation is shifted by d'/tan α toward the upstream side in the step-flow direction of the silicon carbide film 14 that is grown by epitaxial growth, where d' denotes the thickness of the n⁻-type silicon carbide film 14a being the drift layer (FIG. 8A), and a denotes the off angle of the silicon carbide substrate 10 with respect to the (0001) plane.

For example, when the thickness d' of the n⁻-type silicon carbide film 14a as the drift layer is 26 μm and the off angle α is 4 degrees, a mask for ion implantation is designed so that a pattern formed by shifting the pattern of the pn junction region by d'/tan α=372 μm is included in the ion-implanted region 12.

The embodiments have been described with the n⁺-type silicon carbide substrate of the 4H silicon carbide bulk single crystal as an example; however, the embodiments can also be applied to a p⁺-type silicon carbide substrate of a 4H silicon carbide bulk single crystal, an n⁺-type silicon carbide substrate of a 6H silicon carbide bulk single crystal, and a p⁺-type silicon carbide substrate of a 6H silicon carbide bulk single crystal, for example.

Furthermore, the embodiments have been described with an example of the mesa-type PiN diode with a high breakdown voltage as the semiconductor device; however, the embodiments can also be applied to a semiconductor device manufactured by epitaxially growing the silicon carbide film on the silicon carbide substrate of a hexagonal system. For example, the embodiments can be applied to a vertical IGBT and a MOSFET.

While certain embodiments have been described, these embodiments have been presented by way of example only, and are not intended to limit the scope of the inventions. Indeed, the method of manufacturing a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:

preparing a silicon carbide substrate of a hexagonal system;

implanting ions into the silicon carbide substrate;

forming, by epitaxial growth, a silicon carbide film on the silicon carbide substrate into which the ions have been implanted; and forming a pn junction region in the silicon carbide film, wherein the ions are implanted into the silicon carbide substrate such that a region formed by shifting the pn junction region used for device operation by d/tan α toward an upstream side in a step-flow direction of the silicon carbide film, which is grown by epitaxial growth, is included in an ion-implanted region, where d denotes a thickness of the silicon carbide film and α denotes an off angle of the silicon carbide substrate with respect to a (0001) plane.

2. The method according to claim 1, wherein the ions are implanted into the silicon carbide substrate with a temperature of the silicon carbide substrate of 100° C. or less.

3. The method according to claim 1, wherein the ions are implanted into the silicon carbide substrate, a conductivity type of the impurity being identical to a conductivity type of the silicon carbide substrate.

4. The method according to claim 1, wherein the ions are implanted into the silicon carbide substrate with a surface thereof exposed without forming a film on the silicon carbide substrate.

5. The method according to claim 1, wherein the ions are selectively implanted into a predetermined region of the silicon carbide substrate.

6. The method according to claim 1, wherein the silicon carbide substrate is n-type, and ions of phosphorus or nitrogen are implanted into the silicon carbide substrate.

7. The method according to claim 1, wherein a dose of the ions implanted into the silicon carbide substrate is 1E15 cm⁻² or greater and 1E17 cm⁻² or less.

8. The method according to claim 1, wherein a surface of the silicon carbide substrate has an off angle of 1 degree or greater and 8 degrees or less with respect to a (0001) plane in a direction of <21-30>±5 degrees.

* * * * *

UNITED STATES PATENT AND TRADEMARK OFFICE
CERTIFICATE OF CORRECTION

| | | |
|---|---|---|
| PATENT NO. | : 8,679,957 B2 | Page 1 of 1 |
| APPLICATION NO. | : 13/602517 | |
| DATED | : March 25, 2014 | |
| INVENTOR(S) | : Johji Nishio et al. | |

It is certified that error appears in the above-identified patent and that said Letters Patent is hereby corrected as shown below:

On the title page, Item (30), the Foreign Application Priority Data Information has been omitted. Item (30) should read:

--(30)     Foreign Application Priority Data

March 2, 2012     (JP)..............................2012-046503--

Signed and Sealed this
Seventeenth Day of June, 2014

Michelle K. Lee
*Deputy Director of the United States Patent and Trademark Office*